(12) United States Patent
Kidd

(10) Patent No.: US 6,215,990 B1
(45) Date of Patent: Apr. 10, 2001

(54) METHOD AND APPARATUS FOR MINIMIZING INITIAL FREQUENCY ERRORS DURING TRANSCEIVER POWER UP

(75) Inventor: Phillip Kidd, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 08/989,958

(22) Filed: Dec. 12, 1997

(51) Int. Cl.⁷ ....................................................... H04B 7/00
(52) U.S. Cl. .......................... 455/255; 455/257; 455/265; 331/176
(58) Field of Search .................................... 455/255, 257, 455/258, 264, 265, 316, 260, 196.1, 76; 331/175, 176, 214

(56) References Cited

U.S. PATENT DOCUMENTS 4,921,467 * 5/1990 Lax .................................... 455/264
5,392,005 * 2/1995 Bortolini et al. ...................... 331/44

* cited by examiner

*Primary Examiner*—Lee Nguyen
(74) *Attorney, Agent, or Firm*—Jenkens & Gilchrist, P.C.

(57) ABSTRACT

A method and apparatus for minimizing internal frequency errors in a crystal oscillator is disclosed. A microprocessor generates a voltage control signal in response to received inputs regarding the temperature of an associated voltage control temperature controlled crystal oscillator, a value from a default table at the detected temperature and a value from a compensation table at the detected temperature. This information is used to calculate the error for the presently applied voltage control signal. From this error, a new compensation value is calculated and entered into the compensation table at the detected temperature.

24 Claims, 3 Drawing Sheets

METHOD AND APPARATUS FOR MINIMIZING INITIAL FREQUENCY ERRORS DURING TRANSCEIVER POWER UP

BACKGROUND OF THE INVENTION

1. Technical Field of the Invention

The present invention relates to the minimization of frequency errors during power up of a transceiver unit, and more particularly, to a method for minimizing frequency errors due to the effects of temperature differences on a voltage controlled, temperature compensated crystal oscillator.

2. Description of Related Art

The frequency at which a transceiver unit, such as a cellular telephone initially operates during power up is different from the final frequency that the unit operates at once the unit is locked onto a control channel frequency. The further the initial operating frequency of a cellular telephone is from the final frequency of the control channel, the greater the likelihood that the phone may never lock onto the control frequency or the greater amount of time is required to accomplish this goal. As the initial frequency error increases, the cellular telephone's ability to acquire synchronization with the digital control channel (DCCH) decreases.

The factor most greatly affecting the initial frequency error is the initial frequency signal produced by a voltage controlled, temperature compensated crystal oscillator (VCTCXO) within the cellular telephone. Most radio products, such as a cellular telephone, use a modular VCTCXO in which an analog control network compensates for frequency errors caused by variances in the temperature of the crystal oscillator. The analog circuit keeps the VCTCXO frequency within a specified ppm error over a variety of temperatures. The control voltage of the VCTCXO is used to calibrate the device at room temperature and for automatic frequency control (AFC). The initial control voltage value is stored and applied to the VCTCXO at system power up. An AFC algorithm based upon received frequency error reports is used to lock onto the digital control channel.

Due to the high cost of modular VCTCXO products, manufacturers are increasingly producing radios including discrete VCTCXOs with temperature compensation tables. For discrete circuits, the maximum expected frequency error relies upon the specifications of the crystal. The operating characteristics of the crystal can be characterized over various temperature ranges, and multiple temperature tables generated to improve the frequency performance at each particular temperature range. However, the use of a plurality of temperature tables greatly increases the cost of the VCTCXO. The discrete VCTCXO works similarly to the modular VCTCXO. The difference arises in the method of temperature compensation. A discrete VCTCXO stores a hex temperature compensation value that is added or subtracted from a factory calibrated, hex control voltage value. For each temperature value detected by an associated thermistor network, there is an associated hex temperature compensation value stored in the temperature table. Thus, for a given temperature, the microprocessor generates the initial control voltage indicated by the factory calibration value plus a temperature compensation value.

Thus, the need has arisen for a means for improving compensations for frequency drift caused by temperature changes within a cellular telephone that is less complex and more efficient than existing systems.

SUMMARY OF THE INVENTION

The present invention overcomes the foregoing problems with an improved method and apparatus for minimizing initial frequency errors in a voltage controlled temperature compensated crystal oscillator (VCTCXO). Coupled with the crystal oscillator is a digital-to-analoged controller generating a voltage signal to the crystal oscillator in response to an input voltage control signal received from a processing unit. A thermistor network detects the temperature of the crystal oscillator and provides a temperature signal to the processing unit.

The processing unit in response to the temperature signal and input from a default table containing default voltage control values for each of a plurality of temperatures and a compensation table including a plurality of updatable compensation values generates an input voltage control value.

In response to the detected temperature signal and the associated values from the default and compensation tables, the processor calculates an error in the presently applied control voltage signal. From the calculated error a compensation value necessary to overcome the error in the applied controlled voltage value is determined. Once the compensation value is determined a number of tests are performed to assure that the value is not too far from a set of predetermined limits in an attempt to assure the compensation value is not changed due to a non-standard base station. Upon passing the tests the compensation value within the compensation table at the detected temperature may be updated using the determined compensation value.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
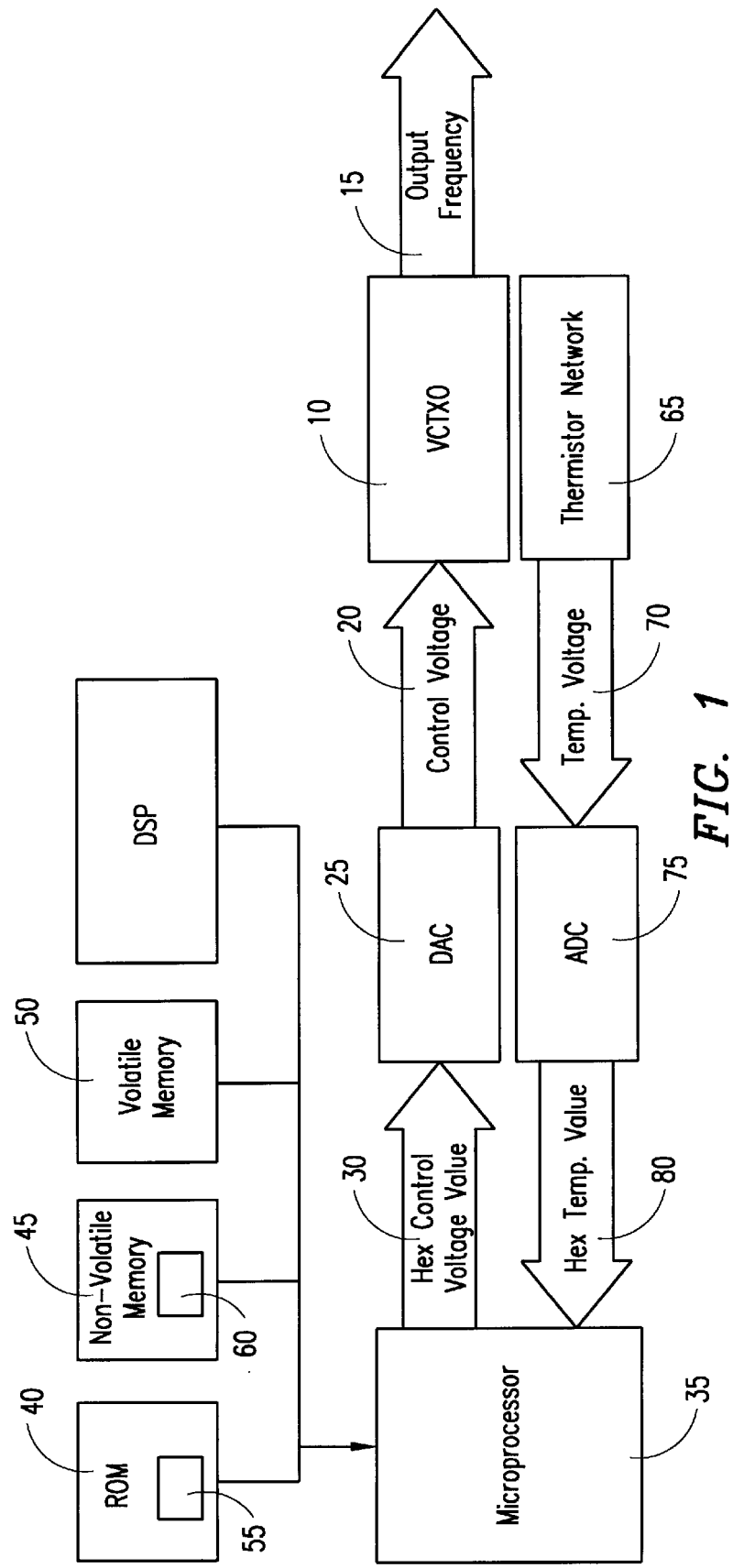
FIG. 1 is a block diagram of an improved control system for a voltage controlled, temperature compensated crystal oscillator (VCTCXO)

Referring now to the Drawings, and more particularly to FIG. 1, there is illustrated a block diagram of a control system for an associated voltage controlled, temperature compensated crystal oscillator (VCTCXO) 10. The VCTCXO 10 generates an output frequency 15 in response to an input control voltage 20 provided by a digital-to-analog converter (DAC) 25. The DAC 25 generates the control voltage 20 in response to an input hexadecimal control voltage value 30 generated in accordance with a method which will be more fully discussed in a moment. The hexadecimal control voltage value 30 is generated by a microprocessor 35 associated with the VCTCXO 10 in response to a number of inputs from tables stored within either a read-only-memory (ROM) 40, nonvolatile memory 45 or volatile memory 50.

These tables include a default temperature table 55 (DEFAULT_TBL) stored in ROM 40. The DEFAULT_TBL 55 comprises a constant table that may not be updated at various temperatures. A temperature compensation table 60 (USED_TBL) is stored in non-volatile memory 45. The USED_TBL 60 may be changed or updated over the life of an associated cellular telephone unit. The USED_TBL 60 comprises updatable compensation values, which are the same as DEFAULT_TBL values initially, used to generate the hexadecimal control voltage value 30 generated by the microprocessor 35. The USED_TBL 60 is continuously updatable based upon temperature information received during operation of the VCTCXO 10.

Temperature data indicating the temperature of the VCTCXO 10 is generated via a thermistor network 65. The temperature measured by the thermistor network 65 enables generation of a temperature voltage output 70 which is converted to a hexadecimal temperature value 80 via an analog-to-digital converter 75. The hexadecimal temperature value 80 is used by the microprocessor 35 to select the proper values from the DEFAULT_TBL 55 and USED_TBL 60.

Figure 2:
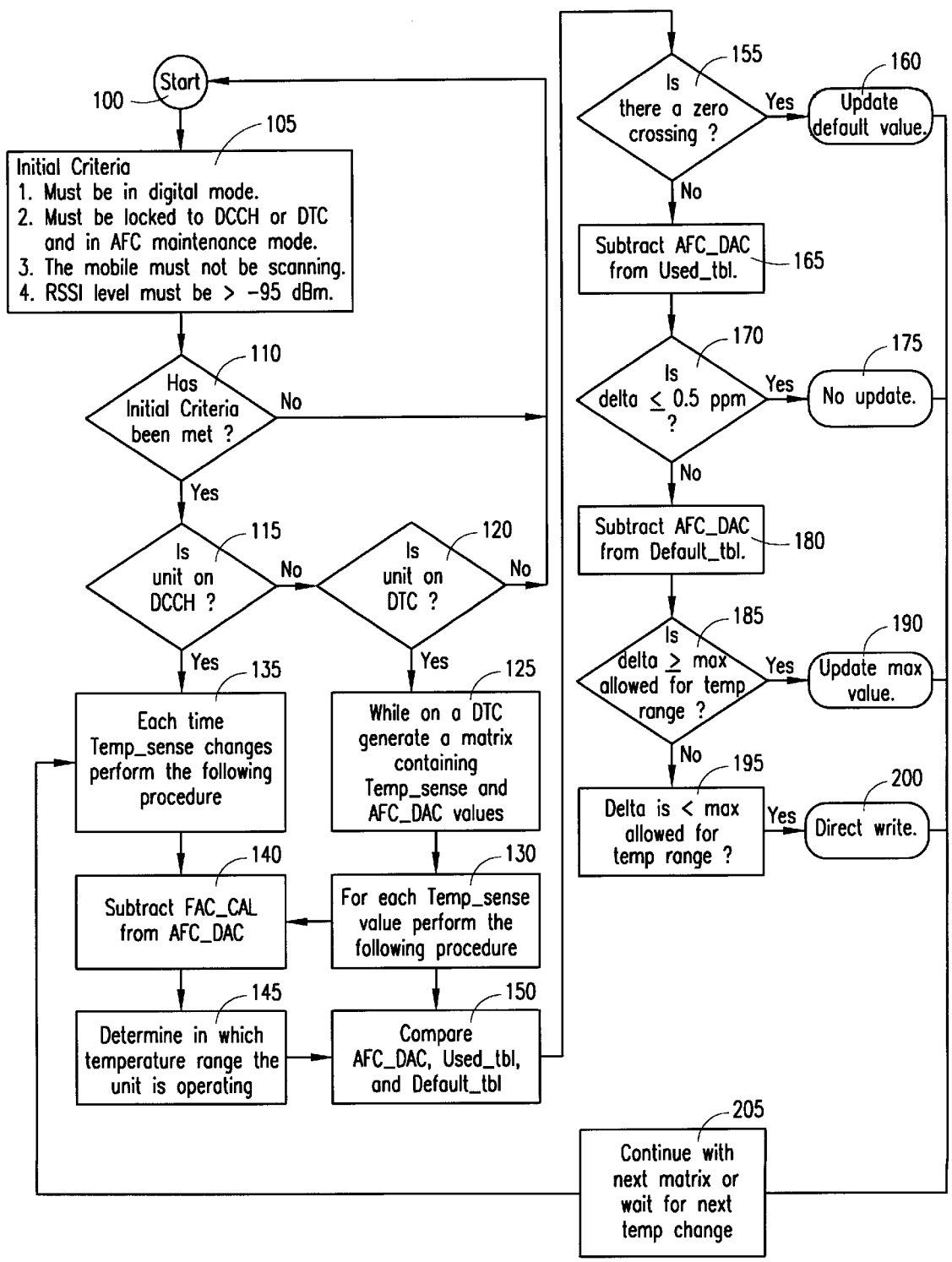
FIG. 2 is a flow diagram of an algorithm for updating a temperature compensation table associated with a VCTCXO.

Referring now to FIG. 2, there is illustrated the process for updating values within the USED_TBL 60. When a cellular telephone is turned on at step 100, the microprocessor 35 initially generates a hexadecimal control voltage value 30 according to a factory calibration offset for 25° C. (FAC_CAL) and a temperature compensation hex value from the temperature compensation table (USED_TBL) 60 added or subtracted from FAC_CAL. The value selected from the temperature compensation table 60 corresponds to a 25° C. temperature of the VCTCXO 10. The first step in updating USED TBL 60 involves confirming that four separate criteria are met prior to any updating of the temperature compensation table 60. This confirmation process occurs while the cellular telephone is camping on a digital control channel (DCCH) or a digital traffic channel (DTC). The criteria include: the cellular telephone must be in a digital mode; the cellular telephone must be locked on to a DCCH or DTC and be in an automatic frequency control maintenance mode; the cellular telephone must not presently be scanning; and the RSSI level of the cellular telephone must be greater than −95 dBm. Inquiry step 110 determines if these four initial criteria have been met. If not, control passes back to the beginning of the flow diagram.

If the initial criteria have been met, inquiry step 115 determines whether or not the cellular telephone is presently camped on a digital control channel. If the phone is not camped on a control channel, inquiry step 120 determines whether the cellular telephone is camped on a digital traffic channel. If the phone is not camped on a traffic channel, the process returns back to the beginning of the flow diagram. If inquiry step 120 determines that the cellular telephone is camped on a digital traffic channel, a matrix relating the cellular telephone temperature (TEMP_SENSE) to the hexadecimal control voltage value 30 (AFC_DAC) must be generated at step 125. The matrix is stored in either volatile memory 50 or non-volatile memory 45. If the matrix is stored in volatile memory 50, the generated table will be lost once the cellular telephone unit is turned off. However, if the matrix is stored in non-volatile memory 45, an additional variable must be set that indicates the status of the matrix (i.e., Has the matrix been used to update the temperature compensation table 60 previously?).

For each position within the matrix at step 130, or if inquiry step 115 determines the telephone is camped on a digital control channel, inquiry step 135 monitors for a change in the cellular telephone temperature (TEMP_SENSE). Once a change in temperature is detected, the factory calibration offset (FAC_CAL) is subtracted from the hexadecimal control voltage value 30 (AFC_DAC) at step 140. This process removes the factory calibration from the hexadecimal control voltage value 30 and results in a value indicating the error from absolute accuracy of the crystal oscillator 10 due to temperature and base station frequency errors. This new value is denoted as AFC_DAC2.

The present temperature of the cellular telephone unit is determined at step 145 from the thermistor network 65. AFC_DAC2 is compared with the USED_TBL and the DEFAULT_TBL values at the detected temperature at step 150. Inquiry step 155 determines whether the addition of AFC_DAC2 to the associated value of the USED_TBL 60 would cause the resulting value to pass through a zero crossing with respect to the DEFAULT_TBL 55 value at the detected temperature. Zero crossing refers to the value of the DEFAULT_TBL 55 value as zero. Thus, if the DEFAULT_TBL 55 value were, for example 3, and the associated value in the USED_TBL changed from 4 to one, a zero crossing would occur.

When inquiry step 155 determines that a zero crossing condition occurs, the value associated with the present temperature in the USED_TBL 60 is updated to the value of the default temperature table (DEFAULT_TBL) 55 at the presently detected temperature at step 160. If no zero crossing exists, the AFC_DAC2 value is subtracted from the value associated with the present temperature within the USED_TBL 60 at step 165. The results of this subtraction are analyzed at inquiry step 170 to determine if the difference is less than or equal to 0.5 ppm. If so, the improvement gained from an update to the USED_TBL is deemed to be too minimal, and no update is performed at step 175.

The 0.5 ppm limit is used to minimize updates. If the initial guess is within 0.5 ppm the guess is close enough. If the difference is greater than 0.5 ppm the AFC_DAC2 is subtracted from the associated temperature value of the DEFAULT_TBL 55 at step 180. Inquiry step 185 then analyzes the difference to determine if the difference is greater than or equal to a predetermined limit for the presently detected temperature range at inquiry step 185. The predetermined limit for selected temperature ranges is calculated from certain parameters associated with the VCTCXO 10. The maximum expected frequency error of the VCTCXO 10 over a particular temperature range are known and associated with the VCTCXO 10. Additionally, a control loop gain ($K_v$ in HZ/V) is also known. Using the control voltage loop gain, a change in ppm per control DAC step can be determined. Once the change in ppm per control DAC step is known, the predetermined limit can be set to the amount of steps the temperature compensation table values are allowed to change from the default temperature compensation table values. This limit prevents non-compliant base stations from pulling the VCTCXO 10 too far from the desired frequency. The predetermined limit is determined by examining the maximum and minimum expected errors due to the crystal parameters over a selected temperature.

Figure 3:
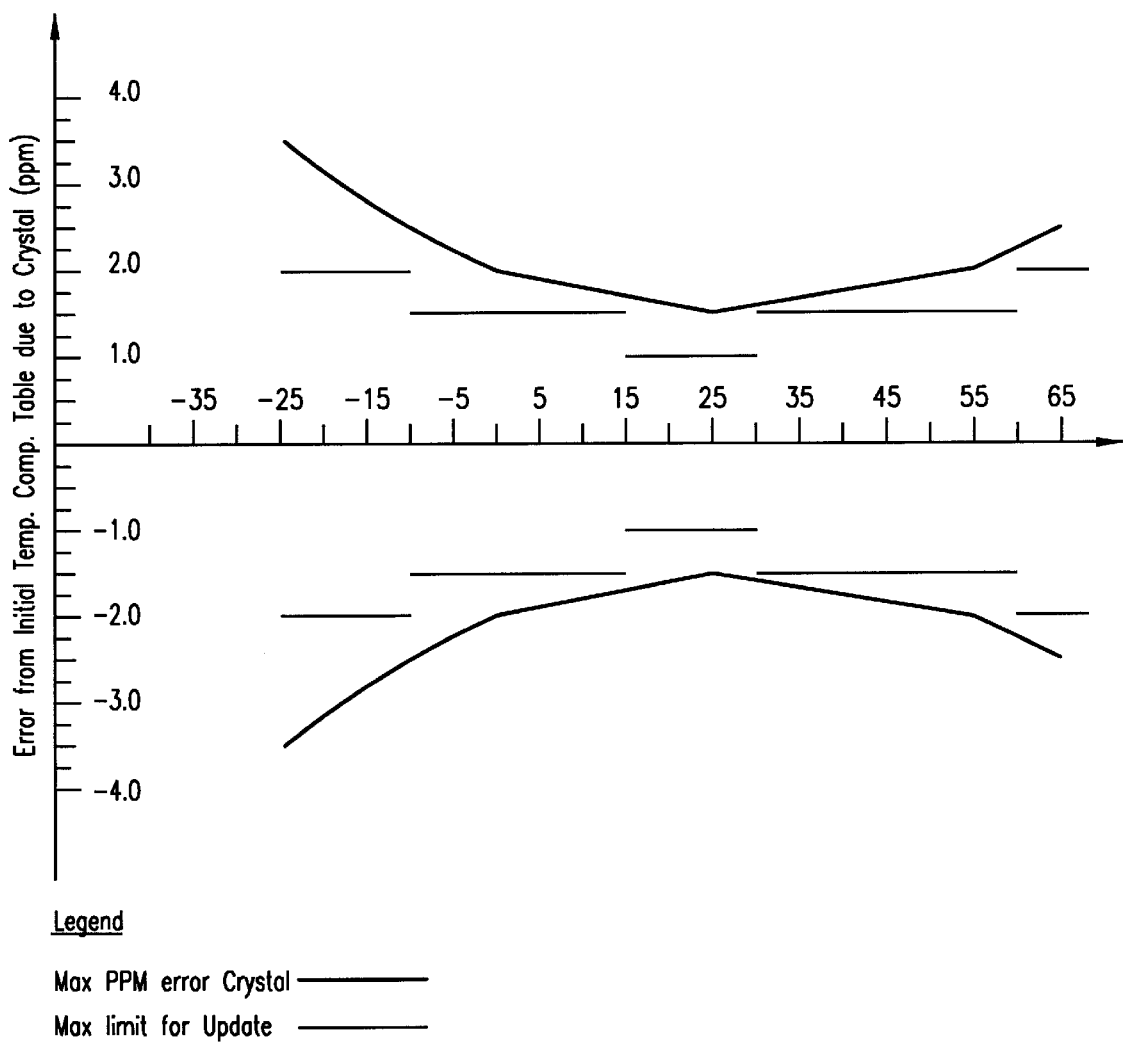
FIG. 3 is a plot of maximum error due to crystal specification tolerance and the allowed update limits for maximum temperature segments.

A cellular telephone's operating temperature range may be divided into a plurality of temperature segments each with varying limits associated therewith. This enables optimization of the update algorithm's performance by developing different limits for each temperature segment. The plot of FIG. 3 provides an example of maximum error due to crystal specification tolerances and the allowed update limits for various temperature segments.

If the difference is greater than the maximum limit for the selected temperature range determined at inquiry step 185, the value for the temperature compensation table 60 is updated only to the maximum possible value. If the temperature difference of the update is less than the maximum limit, a direct write process is performed at step 200 where the AFC_DAC2 to value is inserted into the USED_TBL at the detected temperature. Step 205 continues with the next temperature value in the matrix or waits for an additional temperature change before returning to step 135.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. A method for minimizing initial frequency errors in a crystal oscillator, comprising the steps of:

detecting a temperature of the crystal oscillator;

calculating an error in an applied control voltage value of the crystal oscillator;

determining a compensation value to overcome the calculated error in the applied control voltage value of the crystal oscillator based upon the error in the applied control voltage, a default applied control voltage value associated with the temperature from a default table and a compsensation value associated with the temperature from a table of compensation values; and updating the table of compensation values with the determined compensation value at the detected temperature.

2. The method of claim 1 further including the step of:

determining a set of predetermined criteria are met prior to the step of calculating.

3. The method of claim 2, wherein the predetermined criteria further comprise a mobile station associated with the crystal oscillator being in a digital mode, the mobile station being locked to a digital control or digital traffic channel and being in an automatic frequency control mode, the mobile station not performing a scanning activity and the mobile station having an RSSI level less than approximately −95 dBm.

4. The method of claim 1, wherein the step of calculating an error further includes the step of subtracting a default control voltage value from the applied control voltage value such that a remainder comprises the error in the applied control voltage value.

5. The method of claim 4, wherein the step of determining further comprises the steps of:

comparing to each other the error in the applied control voltage value, the default applied control voltage value from the default table and the compensation value from the table of compensation values to determine if subtracting the error from the compensation value causes a result to pass through the default applied control voltage value.

6. The method of claim 5, wherein the step of updating further comprises the step of:

setting the compensation value in the table of compensation values equal to the default applied control voltage from the default table at the associated temperature if the result would pass through the default applied control voltage.

7. The method of claim 6, wherein the step of determining further comprises the steps of:

subtracting the error from the an original value of the table of compensation values at the detected temperature to determine the new compensation value;

determining if the compensation value is approximately no greater than a predetermined value; and leaving the compensation value as the original value if the new compensation value is greater than the predetermined value.

8. The method of claim 7 wherein the step of determining further comprises, the steps of:

subtracting the error from the default applied control voltage value at the detected temperature if the compensation value is no greater than the predetermined value to determine a difference value;

updating the compensation value to a predetermined limit if the difference value exceeds a preselected limit; and setting the compensation value equal to the error if the difference value is less than the preselected limit.

9. The method of claim 1 further comprising the steps of:

determining whether a receiver unit is operating on a digital control channel or digital traffic channel;

updating all values of the table of compensation values if the receiver unit is operating on a digital traffic channel; and updating values of the compensation table only in response to temperature changes if the receiver unit is operating on a digital control channel.

10. A method for minimizing initial frequency errors in a crystal oscillator, comprising the steps of:

determining a set of predetermined criteria are met;

detecting a temperature of the crystal oscillator;

calculating an error in an applied control voltage value of the crystal oscillator;

determining a compensation value to overcome the calculated error in the applied control voltage value of the crystal oscillator;

updating a table of compensation values with the determined compensation value at the detected temperature;

determining whether a receiver unit is operating on a digital control channel or digital traffic channel;

updating all values of the table of compensation values if the receiver unit is operating on a digital traffic channel; and updating values of the compensation table only in response to temperature changes if the receiver unit is operating on a digital control channel.

11. The method of claim 10 further including the step of:

determining a set of predetermined criteria are met prior to the step of calculating.

12. The method of claim 11, wherein the predetermined criteria further comprise a mobile station associated with the crystal oscillator being in a digital mode, the mobile station being locked to a digital control or digital traffic channel and being in an automatic frequency control mode, the mobile station not performing a scanning activity and the mobile station having an RSSI level less than approximately −95 dBm.

13. The method of claim 10, wherein the step of calculating an error further includes the step of subtracting a default control voltage value from the applied control voltage value such that a remainder comprises the error in the applied control voltage value.

14. The method of claim 13, wherein the step of determining further comprises the step of;

comparing to each other the error in the applied control voltage value, a default applied control voltage value at the detected temperature and a compensation value from the table of compensation values at the detected temperature to determine if subtracting the error from the compensation value causes a result to pass through the default applied control voltage value.

15. The method of claim 14, wherein the step of updating further comprises the step of:

setting the compensation values in the table of compensation values equal to the default applied control voltage at the selected temperature if the compensation value would pass through the default applied control voltage.

16. The method of claim 15, wherein the step of determining further comprises the steps of:

subtracting the error from an original value of the table of compensation values at the detected temperature to determine the compensation value;

determining if the compensation value is approximately no greater than a predetermined value; and leaving the compensation value as the original value if the new compensation value is greater than the predetermined value.

17. The method of claim 16, wherein the step of determining further comprises, the steps of:

subtracting the error from the default applied control voltage value at the detected temperature if the compensation value is no greater than the predetermined value to determine a difference value;

updating the compensation value to a predetermined limit if the difference value exceeds a preselected limit; and setting the compensation value equal to the error if the difference value is less than the preselected limit.

18. A system for minimizing initial frequency errors in a transceiver unit, comprising:

a crystal oscillator for generating an operating frequency of the transceiver unit;

a default table containing a plurality of default voltage control values at a plurality of temperatures;

a compensation table including a plurality of updatable compensation values for providing a compensation value at the plurality of temperatures for the control voltage values;

a temperature sensing network for generating a temperature sensing signal in response to a temperature of the transceiver unit;

a controller for generating a voltage control signal to the crystal oscillator and, responsive to the temperature sensing signal for generating an updated voltage control value for storage in the default table according to a determined error in the voltage control signal, a default applied control voltage value associated with the temperature of the transceiver unit from the default table and a compensation value associated with the temperature from the compensation table.

19. The system of claim 18, wherein the controller updates the compensation table in response to changed operating conditions.

20. The system of claim 19, wherein the controller further determines an error in the input voltage control signal;

subtracts the error from a compensation value in the table of compensation values at a detected temperature to determine a new compensation value;

determines if the new compensation value is approximately no greater than a predetermined value; and leaves the compensation value unchanged if the new compensation value is greater than the predetermined value.

21. The system of claim 20, wherein the controller further subtracts a default control voltage value from the applied control voltage value such that a remainder comprises the error in the applied control voltage value.

22. The system of claim 21, wherein the controller further compares the error in the applied control voltage value, the default applied control voltage value from the default table and the compensation value from the table of compensation values to determine if subtracting the error from the compensation value causes a result to pass through the default applied control voltage; and sets the compensation value in table of compensation value equal to the default applied control voltage value from the default table at the associated temperature if compensation value passes through the default applied control voltage value.

23. The system of claim 22, wherein the controller further subtracts the error from an original value of the table of compensation values at the detected temperature to determine the compensation value;

determines if the compensation value is approximately no greater than a predetermined value; and leaves the compensation value as the original value if the new compensation value is greater than the predetermined value.

24. The system of claim 23, wherein the controller further subtracts the error from the default applied control voltage value at the detected temperature if the compensation value is not greater than the predetermined value to determine a difference value;

updates the compensation value to a predetermined limit if the difference value exceeds a preselected limit; and sets the compensation value equal to the error if the difference value is less than the preselected limit.

* * * * *